United States Patent
Liu

(10) Patent No.: US 7,852,661 B2
(45) Date of Patent: Dec. 14, 2010

(54) WRITE-ASSIST SRAM CELL

(75) Inventor: Jack Liu, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 176 days.

(21) Appl. No.: 12/345,263

(22) Filed: Dec. 29, 2008

(65) Prior Publication Data

US 2010/0097844 A1     Apr. 22, 2010

Related U.S. Application Data

(60) Provisional application No. 61/107,469, filed on Oct. 22, 2008.

(51) Int. Cl.
*G11C 11/00* (2006.01)
(52) U.S. Cl. ............. 365/154; 365/189.16; 365/230.06; 365/156
(58) Field of Classification Search ................. 365/154, 365/156, 189.16, 230.06
See application file for complete search history.

(56) References Cited

U.S. PATENT DOCUMENTS

| | | | |
|---|---|---|---|
| 6,542,401 B2 | 4/2003 | Yamauchi et al. | |
| 6,590,802 B2 | 7/2003 | Nii | |
| 6,606,276 B2 | 8/2003 | Yamauchi et al. | |
| 6,953,726 B2 | 10/2005 | Nowak et al. | |
| 7,177,177 B2 | 2/2007 | Chuang et al. | |
| 7,511,988 B2 * | 3/2009 | Lin et al. | 365/154 |
| 7,613,031 B2 * | 11/2009 | Hanafi et al. | 365/154 |
| 7,643,357 B2 * | 1/2010 | Braceras et al. | 365/189.09 |

OTHER PUBLICATIONS

Ramadurai, V., et al., "A Disturb Decoupled Column Select 8T SRAM Cell," IEEE 2007 Custom Integrated Circuits Conference (CICC), 2007, pp. 25-28.

* cited by examiner

*Primary Examiner*—Tuan T Nguyen
*Assistant Examiner*—Toan Le
(74) *Attorney, Agent, or Firm*—Slater & Matsil, L.L.P.

(57) ABSTRACT

An integrated circuit structure includes a word-line; a column select line; and a latch. The latch includes a first storage node and a second storage node complementary to each other; and an operation voltage node. A control circuit is coupled between the operation voltage node and the latch. The control circuit includes a first input coupled to the word-line; and a second input coupled to the column selection line. The control circuit is configured to interconnect the operation voltage node and the latch when both the word-line and the column select line are selected, and disconnect the operation voltage node and the latch when at least one of the word-line and the column select line is not selected.

14 Claims, 5 Drawing Sheets

WRITE-ASSIST SRAM CELL

This application claims the benefit of the following provisionally filed U.S. patent application: Application Ser. No. 61/107,469, filed Oct. 22, 2008, and entitled "8T Write-Assist SRAM Cell," which application is hereby incorporated herein by reference.

CROSS-REFERENCE TO RELATED APPLICATION

This application relates to the following commonly assigned U.S. patent application Ser. No. 12/238,850, filed Sep. 26, 2008, and entitled "Robust 8T SRAM Cell," which application is hereby incorporated herein by reference.

TECHNICAL FIELD

This invention relates generally to integrated circuits, and more particularly to memory cell design, and even more particularly to the structure of static random access memory (SRAM) cells.

BACKGROUND

Static random access memory (SRAM) is commonly used in integrated circuits. SRAM cells have the advantageous feature of holding data without a need for refreshing. SRAM cells may include different numbers of transistors, and are often accordingly referred to by the number of transistors, for example, six-transistor (6-T) SRAM, eight-transistor (8-T) SRAM, and the like. The transistors typically form a data latch for storing a bit. Additional transistors may be added to control the access to the transistors. SRAM cells are typically arranged as an array having rows and columns. Typically, each row of the SRAM cells is connected to a word-line, which determines whether the current SRAM cell is selected or not. Each column of the SRAM cells is connected to a bit-line (or a pair of bit-lines), which is used for storing a bit into, or reading a bit from, the SRAM cell.

With the increasing down-scaling of integrated circuits, the operation voltages of the integrated circuits are reduced, along with the operation voltages of memory circuits. Accordingly, read and write margins of the SRAM cells, which measure how reliably the bits of the SRAM cells can be read from and written into, are reduced. Due to the existence of static noise, the reduced read and write margins may cause errors in the respective read and write operations.

Various approaches have been explored to lower VCCmin, which is the minimum operation voltage VCC required for reliable read and write operations, and to suit the ever-decreasing operation voltages. For example, a negative bit-line technique was used to improve cell write-ability at low operation voltage, particularly when the word-line voltage is suppressed. Referring to FIG. 1, which is a 6-T SRAM cell, a "0" bit is to be written into the illustrated SRAM cell. Bit-line BL hence carries a low voltage representing a logic low and bit-line BLB carriers a high voltage representing a logic high. Node 10 is at a high voltage, while node 12 is at a low voltage. To write a "0" bit into the SRAM cell, a negative voltage, for example, −100 mV, is put on bit-line BL. The negative voltage causes an increase in the voltage difference between node 10 and bit-line BL. Accordingly, the write operation becomes easier and VCCmin may be reduced.

The negative bit-line technique, however, comes with a price. Typically the negative voltage is generated using a charge pump (not shown), which receives operation voltage VDD and outputs the negative voltage. FIG. 2 schematically illustrates the relationship between operation voltage VDD and the negative bit-line voltage generated by the charge pump. It is noted that if operation voltage VDD becomes lower, the magnitude of the negative voltage also reduces, if the same charge pump is used. This trend, however, defeats the purpose of having the negative bit-line voltage. As is well perceived, if operation voltage VDD is reduced, the magnitude of the negative bit-line voltage needs to be greater in order to offset the reduction in operation voltage VDD. One way to solve this problem is to adopt larger charge pumps when operation voltage VDD is reduced. However, such a solution requires more chip area. Alternative solutions are thus needed.

SUMMARY OF THE INVENTION

In accordance with one aspect of the present invention, an integrated circuit structure includes a word-line; a column select line; and a latch. The latch includes a first storage node and a second storage node complementary to each other; and an operation voltage node. A control circuit is coupled between the operation voltage node and the latch. The control circuit includes a first input coupled to the word-line; and a second input coupled to the column select line. The control circuit is configured to interconnect the operation voltage node and the latch when both the word-line and the column select line are selected, and disconnect the operation voltage node and the latch when at least one of the word-line and the column select line is not selected.

In accordance with another aspect of the present invention, an integrated circuit structure includes a first signal line; a second signal line disconnected from the first signal line; an operation voltage node; a first bit-line and a second bit-line complementary to each other; and a pair of cross-coupled inverters including a first storage node and a second storage complementary to each other. A first NMOS transistor is coupled between the first bit-line and the first storage node, and includes a gate coupled to the first signal line. A second NMOS transistor is coupled between the second bit-line and the second storage node, and includes a gate coupled to the second signal line. A first PMOS transistor has a gate connected to the first signal line, a source coupled to the operation voltage node, and a drain coupled to sources of PMOS transistors of the pair of cross-coupled inverters. A second PMOS transistor has a gate connected to the second signal line, a source coupled to the operation voltage node, and a drain connected to the drain of the first PMOS transistor.

In accordance with yet another aspect of the present invention, an integrated circuit structure includes a plurality of static random access memory (SRAM) cells arranged in rows and columns. Each of the SRAM cells includes a pair of cross-coupled inverters including a first storage node and a second storage node complementary to each other; an operation voltage node; and a control circuit coupled between the operation voltage node and the pair of cross-coupled inverters. The control circuit includes a first input and a second input, and is configured to interconnect the operation voltage node to the pair of cross-coupled inverters when both the first input and the second input have "selected" signals, and disconnect the operation voltage node from the pair of cross-coupled inverters when at least one of the first input and the second input has an "unselected" signal. The integrated circuit structure further includes a plurality of word-lines, with each of the plurality of word-lines being coupled to the first input of each of the SRAM cells in a respective row. The integrated circuit structure further includes a plurality of column select lines, with each of the plurality of column select lines being coupled to the second input of each of the SRAM cells in a respective column.

The advantageous features of the present invention include reliable write operations that do not depend on negative bit-line voltages, and reduced chip area penalty.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention and do not limit the scope of the invention.

A novel static random access memory (SRAM) cell embodiment is provided. The variations and operation of the embodiment are discussed. Throughout the various views and illustrative embodiments of the present invention, like reference numbers are used to designate like elements.

Figure 1:
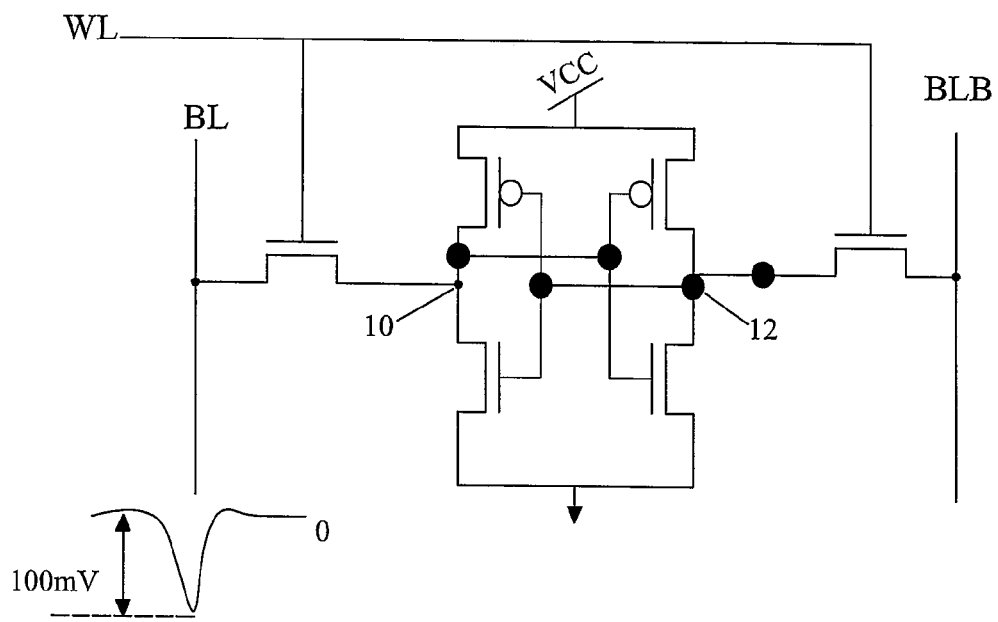
FIG. 1 illustrates a conventional 6-T static random access memory (SRAM) cell, wherein a negative bit-line voltage is used for writing into the SRAM cell in order to reduce VCC-min.
Figure 2:
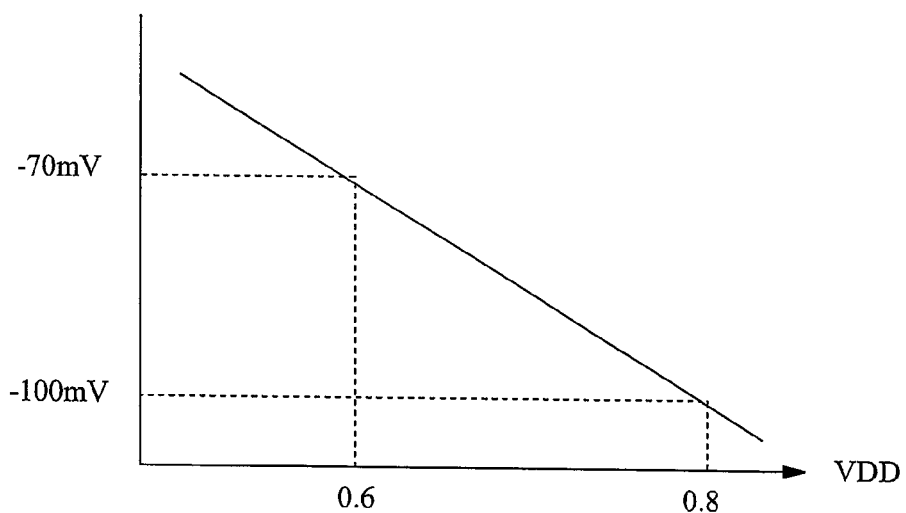
FIG. 2 illustrates the relationship between operation voltage VDD and the negative bit-line voltage generated from the operation voltage.
Figure 3:
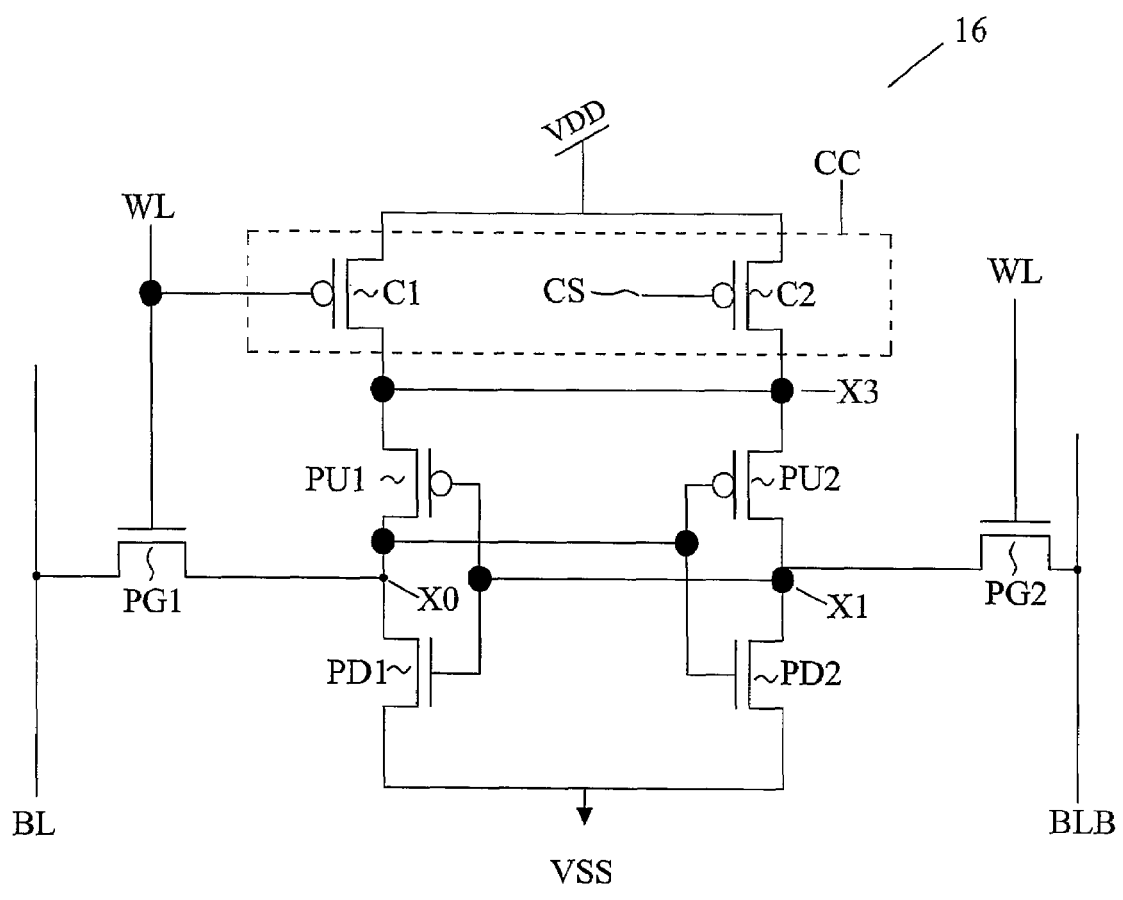
FIG. 3 illustrates an embodiment of the present invention, wherein a control circuit is provided to control the power supply to storage nodes.

FIG. 3 illustrates an embodiment of the present invention, which includes eight-transistor (8-T) SRAM cell 16. SRAM cell 16 includes pull-up transistors PU1 and PU2, pull-down transistors PD1 and PD2, and pass-gate transistors PG1 and PG2. The drains of pull-up transistor PU1 and pull-down transistor PD1 are interconnected to form an inverter, and the drains of pull-up transistor PU2 and pull-down transistor PD2 are interconnected to form another inverter. The two inverters are cross-coupled to form a data latch. Storage node X0 of the data latch is coupled to bit-line BL through pass-gate transistor PG1, while storage node X1 is coupled to bit-line BLB through pass-gate transistor PG2, wherein storage nodes X0 and X1 are complementary nodes that are often at opposite logic levels (logic high or logic low). The gates of pass-gate transistors PG1 and PG2 are connected to word-line VL. SRAM cell 16 is coupled between operation voltages VDD and VSS. Operation voltage VDD may be the same voltage provided to core circuits, or the converted voltage (often referred to as voltage CVDD) different from the core operation voltage.

SRAM cell 16 further includes control transistors C1 and C2. In an embodiment, the gate of control transistor C1 is connected to word-line WL, while the gate of control transistor C2 is connected to column select line CS, which is used to select the respective column for write operations. Column select line CS may be coupled to, and receive signal from a local I/O block (not shown), which provides the column select signals to all of the column select lines in the same SRAM array (please refer to FIG. 4), in which SRAM cell 16 is located. The drains of control transistors C1 and C2 are interconnected. In the following discussions, control transistors C1 and C2 in combination are referred to as control circuit CC, wherein the gates of control transistors C1 and C2 are the inputs of control circuit CC.

Control circuit CC controls the connection of operation voltage VDD, which is at an operation voltage node (also referred to as node VDD). As illustrated in FIG. 3, only when both word-line WL and column select line CS are at logic high, that is high enough to turn off both transistors C1 and C2, the connection between node X3 and operation voltage VDD is disconnected. If any of word-line WL and column select line CS is at a logic low, the connection between node X3 and operation voltage VDD is established, and operation voltage VDD is supplied to node X3.

Figure 4:
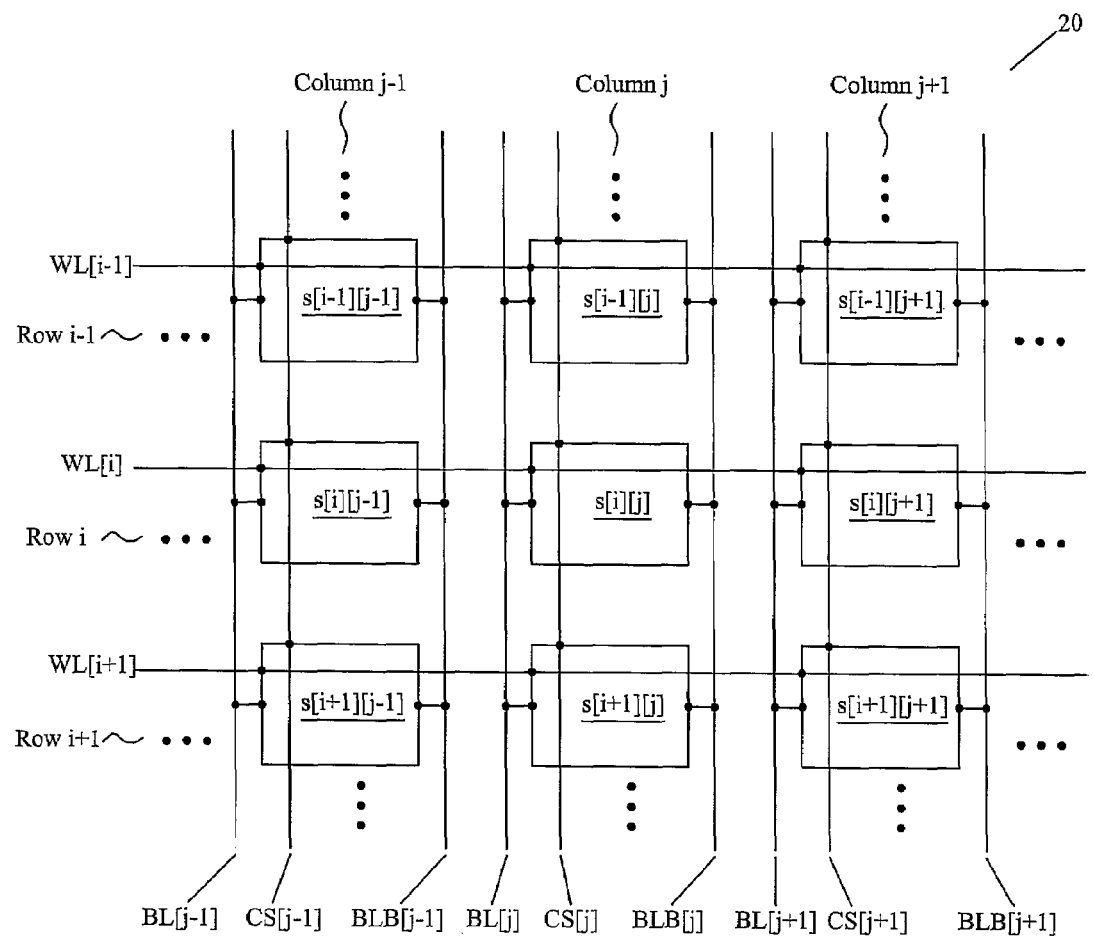
FIG. 4 illustrates an SRAM array.

FIG. 4 illustrates a portion of SRAM array 20 including a plurality of SRAM cells arranged in rows and columns. The SRAM cells are indicated as S followed by a first integer and a second integer, both in brackets, wherein the first integer and the second integer are the row number and column number, respectively. Word-lines WL, bit-lines BL and BLB, and column select lines CS are also marked using the respective row number or column number. The detailed structure of the SRAM cells may be referred to in FIG. 3 or FIG. 5. In the following discussion, it is assumed that row i and column j are selected, and hence the cross-point SRAM cell S[i][j] is the selected cell, while other SRAM cells are not selected. Throughout the description, logic highs on word-lines WL and column select lines CS are referred to as "selected" signals, while logic lows on word-lines WL and column select lines CS are referred to "unselected" signals. One skilled in the art will realize that a cross-point cell may be selected by applying logic lows to the respective word-line and column select line instead, for example, by replacing pass-gate transistors PG1 and PG2 with PMOS transistors. However, the concept of the present invention still applies.

In a write operation, SRAM cell S[i][j] is selected for being written into, word-line WL[i] and column select line CS[j] thus carry logic high signals. Bit-lines BL[j] and BLB[j] are set according to the value that will be written into SRAM cell S[i][j], with bit-lines BL[j] and BLB[j] having opposite logic values. Control transistors C1 and C2 (refer to FIG. 3) of SRAM cell S[i][j] are both turned off by the high voltages on word-line WL[i] and column select line CS[j]. Accordingly, operation voltage VDD is isolated from node X3. The write operation is hence easier and faster.

In the write operation, the unselected cells in row i experience dummy read operations. Since during the write operations, the column select lines for all unselected columns are at logic low, the control transistors C2 (refer to FIG. 3) of the unselected SRAM cells, such as SRAM cells S[i][j−1] and SRAM cell S[i][j+1] in row i are turned on, and operation voltage VDD is provided to node X3. The unselected cells in row i thus act like control transistors C1 and C2 do not exist and operation voltage node VDD is directly connected to node X3. The values stored in these unselected SRAM cells will be retained.

Similarly, in the write operation, the unselected cells in column j will retain their values. Since the signals on word-lines of all unselected rows are low, the control transistors C1 (refer to FIG. 3) of the unselected SRAM cells in column j, such as SRAM cells S[i−1][j] and SRAM cell S[i+1][j] are turned on, and operation voltage VDD is provided to node X3. The unselected cells in column j thus act like control transistors C1 and C2 do not exist and operation voltage node VDD is directly connected to node X3. The values stored in these unselected SRAM cells will be retained. For all SRAM cells in the unselected rows and unselected columns, all of their control transistors C1 and C2 are turned on since their word-lines WL and column select lines CS are all at the logic low, and the nodes X3 of these SRAM cells will be at operation voltage VDD. Accordingly, SRAM cells in the unselected rows and unselected columns will retain their values.

In read operations, all column select lines CS in SRAM array 20 are at low voltages. Accordingly, all control transistors C2 in all of the SRAM cells are turned on, and hence operation voltage VDD is provided to nodes X3 of all of the SRAM cells, and the SRAM cells of SRAM array 20 act like conventional 6-T SRAM cells.

To summarize the above-discussed operations, in write operations, the control circuit CC in the selected SRAM cells disconnect the latch formed of transistors PU1, PU2, PD1, and PD2 from operation voltage VDD, while in read operations and/or for unselected SRAM cells in write operations, control circuit CC connects the operation voltage VDD to node X3 (see FIG. 3).

Figure 5:
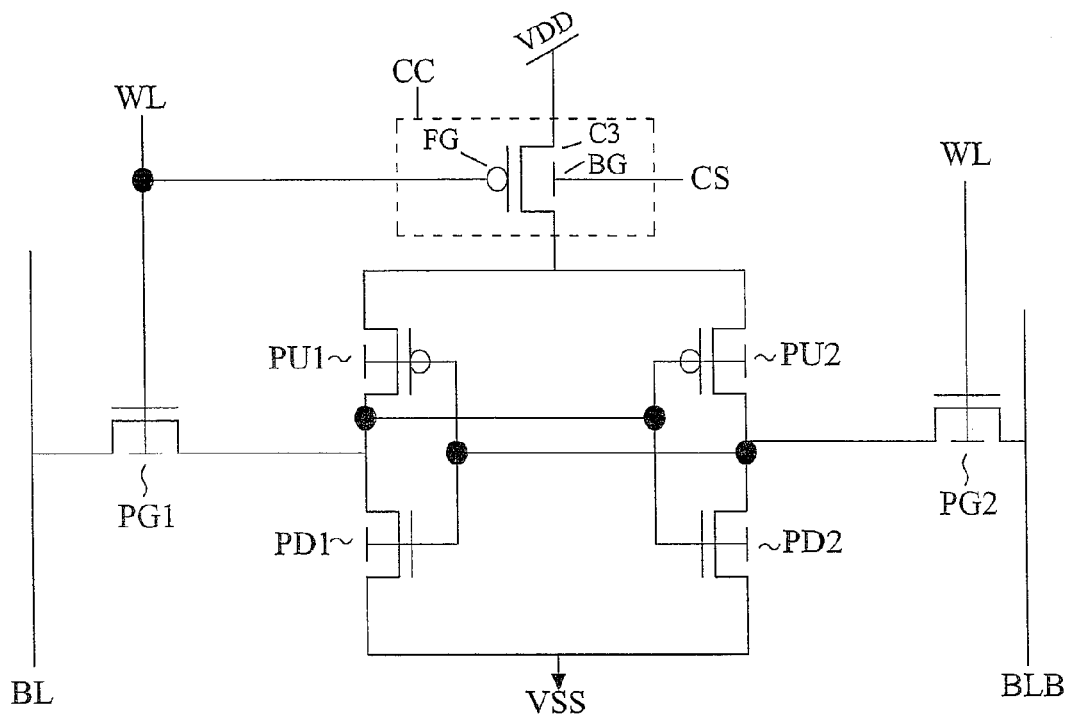
FIG. 5 illustrates the implementation of the embodiment of the present invention using dual-gate transistors.

It is realized that the function of control circuit CC as shown in FIG. 3 may be implemented using other devices. For example, FIG. 5 illustrates an embodiment in which control circuit CC is implemented using a dual-gate transistor C3 having front gate FG and back-gate BG. Dual-gate transistor C3 is turned on if at least one of front gate FG and back-gate BG is at logic low. If both front gate FG and back-gate BG are at logic high, transistor C3 is turned off. Transistors PU1, PU2, PD1, PD2, PG1, and PG2 may be implemented using normal transistors with each having only one gate, or using dual-gate transistors having their front gates connected to the respective back-gates.

Figure 6:
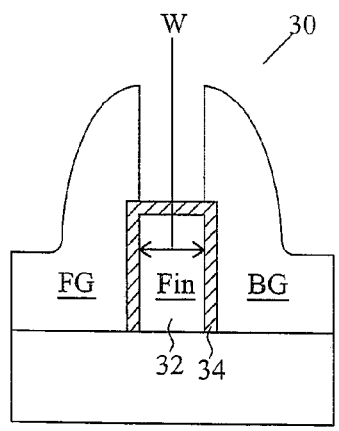
FIG. 6 illustrates a cross-sectional view of a dual-gate FinFET.

An exemplary dual-gate FinFET 30 is shown in FIG. 6, which illustrates a cross-sectional view of the FinFET. Fin-FET 30 includes semiconductor fin 32, gate dielectric 34, front gate FG on one of the sidewalls of fin 32, and back-gate BG on the opposite sidewall of fin 32. Fin 32 preferably has a small width W so that when the channel controlled by front gate FG and the channel controlled by back-gate BG are both turned off, the entire fin is turned off. The formation of front gate FG and the back-gate BG may include forming a gate electrode layer and patterning the gate electrode layer. During the patterning of the gate electrode layer, a portion of the gate electrode layer directly over fin 32 is etched to separate front gate FG and the back-gate BG from each other. Alternatively, front gate FG and back-gate BG may be separated by a chemical mechanical polish.

As a matter of fact, the embodiment shown in FIG. 3 may be treated as a same embodiment as shown in FIG. 5, wherein control transistor C1 may be treated as a transistor formed of front gate FG, and control transistor C1 may be treated as a transistor formed of back-gate BG.

It is realized that although in the embodiments of the present invention, control circuit CC is added to a 6-T SRAM cell, the concept of control circuit CC may also be applied to other SRAM cells having a different number of transistors, and having different structures. One skilled in the art, with the teaching provided in the preceding paragraphs, will be able to realize the implementation details.

Figure 7:
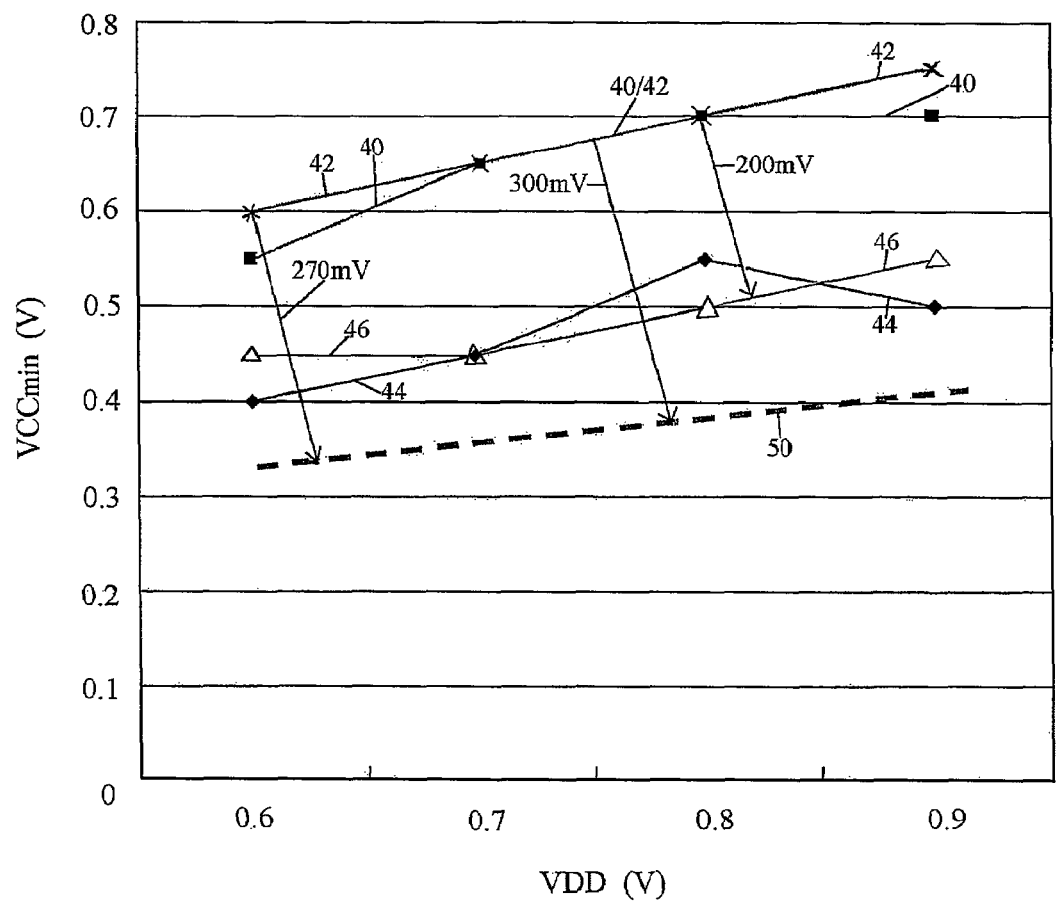
FIG. 7 shows the simulation results, wherein VCCmins obtained from the embodiments of the present invention are compared to the VCCmins of conventional 6-T SRAM cells.

By using the embodiments of the present invention, the VCCmins of SRAM cells are significantly reduced. FIG. 7 illustrates simulation results, wherein the X-axis indicates the operation voltage VDD (refer to FIG. 3), and the Y-axis indicates the VCCmin. Lines 40 and 42 are obtained from conventional 6-T SRAM cells (with operation temperatures being 125° C. and −40° C., respectively). Lines 44 and 46 are the results obtained from the embodiments of the present invention (with operation temperatures being 125° C. and −40° C., respectively). The simulation results have revealed that the VCCmins of the embodiments of the present invention are reduced by about 200 mV compared to that of conventional 6-T SRAM cells. Further, the embodiments of the present convention can be combined with the using of negative bit-lines during write operations. The corresponding results are shown as line 50, which indicates that the VCCmins can be further reduced by an additional 100 mV if −100 mV bit-line voltage is used. Significantly, this results in a VCCmin reduction from about 0.7V-0.8V to about 0.4V-0.6V.

The embodiments of the present invention have small chip area penalty. If the embodiments of the present invention are implemented using conventional planar MOS transistors, only about 15% extra chip area over the chip area of the conventional 6-T SRAM cells is needed. If however, the embodiments of the present invention are implemented using dual-gate FinFETs, the required extra chip area is further reduced to about 10%.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An integrated circuit structure comprising:
   a word-line;
   a column select line;
   a latch comprising a first storage node and a second storage node complementary to each other;
   an operation voltage node; and
   a control circuit coupled between the operation voltage node and the latch, wherein the control circuit comprises:
      a first input coupled to the word-line; and
      a second input coupled to the column selection line, wherein the control circuit is configured to interconnect the operation voltage node and the latch when both the word-line and the column selection line are selected, and disconnect the operation voltage node and the latch when at least one of the word-line and the column selection line is not selected.

2. The integrated circuit structure of claim 1, wherein the control circuit comprises:
   a first PMOS transistor comprising a first gate coupled to the first input, a first source coupled to the operation voltage node, and a first drain coupled to the latch; and
   a second PMOS transistor comprising a second gate coupled to the second input, a second source coupled to the operation voltage node, and a second drain connected to the first drain.

3. The integrated circuit structure of claim 1, wherein the control circuit comprises a dual-gate PMOS transistor comprising:
   a front gate coupled to the first input;
   a back-gate coupled to the second input;
   a source coupled to the operation voltage node; and
   a drain coupled to the latch.

4. The integrated circuit structure of claim 3, wherein the dual-gate PMOS transistor is a FinFET comprising a fin, and wherein the front gate is on a first sidewall of the fin, and the back-gate is on a second sidewall of the fin opposite the first sidewall.

5. The integrated circuit structure of claim 1, wherein the latch comprises:
   a first pull-up transistor;
   a second pull-up transistor, wherein sources of the first pull-up transistor and the second pull-up transistor are connected to the control circuit;
   a first pull-down transistor;
   a second pull-down transistor, wherein drains of the first pull-down transistor and the second pull-down transistor are coupled to drains of the first pull-up transistor and the second pull-up transistor, respectively;
   a first bit-line and a second bit-line forming a complementary pair;
   a first pass-gate transistor coupled between the first bit-line and drains of the first pull-up transistor and the first pull-down transistor, wherein a gate of the first pass-gate transistor is coupled to the word-line; and
   a second pass-gate transistor coupled between the second bit-line and drains of the second pull-up transistor and the second pull-down transistor, wherein a gate of the second pass-gate transistor is coupled to the word-line.

6. An integrated circuit structure comprising:
   a first signal line;
   a second signal line disconnected from the first signal line;
   an operation voltage node;
   a first bit-line and a second bit-line complementary to each other;
   a pair of cross-coupled inverters comprising a first storage node and a second storage node complementary to each other;
   a first NMOS transistor coupling the first bit-line to the first storage node, wherein the first NMOS transistor comprises a gate coupled to the first signal line;
   a second NMOS transistor coupling the second bit-line to the second storage node, wherein the second NMOS transistor comprises a gate coupled to the second signal line;
   a first PMOS transistor comprising a gate connected to the first signal line, a source coupled to the operation voltage node; and a drain coupled to sources of PMOS transistors of the pair of cross-coupled inverters; and
   a second PMOS transistor comprising a gate connected to the second signal line, a source coupled to the operation voltage node; and a drain connected to the drain of the first PMOS transistor.

7. The integrated circuit structure of claim 6, wherein the first signal line is a word-line, and the second signal line is a column select line.

8. The integrated circuit structure of claim 6, wherein the first PMOS transistor and the second PMOS transistor are discrete MOS transistors.

9. The integrated circuit structure of claim 6, wherein the first PMOS transistor and the second PMOS transistor are portions of a dual-gate MOS transistor, with the gate of the first PMOS transistor being a front gate of the dual-gate MOS transistor, and the gate of the second PMOS transistor being a back-gate of the dual-gate MOS transistor.

10. The integrated circuit structure of claim 9, wherein the dual-gate MOS transistor is a dual-gate FinFET transistor.

11. An integrated circuit structure comprising:
    a plurality of static random access memory (SRAM) cells arranged in rows and columns, wherein each of the SRAM cells comprises:
       a pair of cross-coupled inverters comprising a first storage node and a second storage node complementary to each other;
       an operation voltage node; and
       a control circuit coupled between the operation voltage node and the pair of cross-coupled inverters, the control circuit comprising a first input and a second input, wherein the control circuit is configured to interconnect the operation voltage node to the pair of cross-coupled inverters when both the first input and the second input have "selected" signals, and disconnect the operation voltage node from the pair of cross-coupled inverters when at least one of the first input and the second input has an "unselected" signal;
    a plurality of word-lines, with each of the plurality of word-lines being coupled to the first input of each of the SRAM cells in a respective row; and
    a plurality of column select lines, with each of the plurality of column select lines being coupled to the second input of each of the SRAM cells in a respective column.

12. The integrated circuit structure of claim 11, wherein the control circuit in each of the plurality of SRAM cells comprises:
    a first PMOS transistor comprising a first gate coupled to the first input, a first source coupled to the operation voltage node, and a first drain coupled to the pair of cross-coupled inverters; and
    a second PMOS transistor comprising a second gate coupled to the second input, a second source coupled to the operation voltage node, and a second drain connected to the first drain.

13. The integrated circuit structure of claim 11, wherein the control circuit comprises a dual-gate PMOS transistor comprising a front gate coupled to the first input, a back-gate coupled to the second input, a source coupled to the operation voltage node, and a drain coupled to the pair of cross-coupled inverters.

14. The integrated circuit structure of claim 13, wherein the dual-gate PMOS transistor is a FinFET comprising a fin, and wherein the front gate is on a first sidewall of the fin, and the back-gate is on a second sidewall of the fin opposite the first sidewall.

* * * * *